United States Patent
Shen et al.

(10) Patent No.: US 10,667,421 B2
(45) Date of Patent: May 26, 2020

(54) HIGH-VOLTAGE ISOLATING DEVICE AND METHOD

(71) Applicant: Delta Electronics, Inc., Taoyuan, Taiwan (CN)

(72) Inventors: Guoqiao Shen, Taoyuan (CN); Jinfa Zhang, Taoyuan (CN); Linfeng Zhong, Taoyuan (CN); Qunbo Zheng, Taoyuan (CN)

(73) Assignee: Delta Electronics, Inc., Taoyuan, Taiwan (CN)

( * ) Notice: Subject to any disclaimer, the term of this patent is extended or adjusted under 35 U.S.C. 154(b) by 0 days.

(21) Appl. No.: 16/291,057

(22) Filed: Mar. 4, 2019

(65) Prior Publication Data

US 2019/0289742 A1    Sep. 19, 2019

(30) Foreign Application Priority Data

Mar. 19, 2018   (CN) ............. 2018 1 0226020

(51) Int. Cl.
| | |
|---|---|
| H05K 7/14 | (2006.01) |
| H01R 13/66 | (2006.01) |
| H02B 1/015 | (2006.01) |
| H05K 7/10 | (2006.01) |
| H05K 7/20 | (2006.01) |

(52) U.S. Cl.
CPC ....... H05K 7/1432 (2013.01); H01R 13/6666 (2013.01); H02B 1/015 (2013.01);
(Continued)

(58) Field of Classification Search
None
See application file for complete search history.

(56) References Cited

U.S. PATENT DOCUMENTS

| | | | |
|---|---|---|---|
| 4,004,113 A | 1/1977 | Ericson et al. | |
| 5,206,468 A * | 4/1993 | Kobayashi | H02B 11/133 |
| | | | 200/50.23 |

(Continued)

FOREIGN PATENT DOCUMENTS

| | | |
|---|---|---|
| CA | 496716 A | 10/1953 |
| CN | 104242134 A | 12/2014 |
| CN | 206313315 U | 7/2017 |

OTHER PUBLICATIONS

Schneider: "Low voltage electrical distribution", Internet, Jun. 30, 2009 (Jun. 30, 2009), pp. 1-54, XP055608581, Retrieved from the Internet:URL:http://www.studiecd.dk/pdfs/all/51201116AA_Masterpact_NT_User Manual.pdf [retrieved on Jul. 24, 2019]*p. 13-p. 17 *.

(Continued)

*Primary Examiner* — Courtney L Smith
(74) *Attorney, Agent, or Firm* — Yunling Ren (57) ABSTRACT

The present disclosure provides a high-voltage isolating device and method. The high-voltage isolating device includes a power module and a shelf. The power module's back panel is provided with a first connecting portion, and the power module's front panel is provided with a first fastening member. The shelf includes a module slot for accommodating the power module. The module slot's rear end is provided with a second connecting portion, and the module slot's front end is provided with a second fastening member. Wherein in a first status, the first connecting portion is matched and connected with the second connecting portion, and the first fastening member is away from the second fastening member, and in a second status, the first connecting portion is disconnected from the second con-
(Continued)

necting portion, and the first fastening member and the second fastening member are matched and connected together by a padlock.

20 Claims, 10 Drawing Sheets

(52) U.S. Cl.
CPC ............ *H05K 7/10* (2013.01); *H05K 7/1414* (2013.01); *H05K 7/1438* (2013.01); *H05K 7/1492* (2013.01); *H05K 7/20709* (2013.01)

(56) References Cited

U.S. PATENT DOCUMENTS

| | | | |
|---|---|---|---|
| 6,563,063 B1 * | 5/2003 | Moore | H01H 9/26 200/43.16 |
| 8,643,225 B2 | 2/2014 | Scharnick et al. | |
| 9,756,748 B1 | 9/2017 | Handshoe | |
| 10,027,096 B2 * | 7/2018 | Jakkireddy | H02B 1/14 |
| 2004/0159530 A1 * | 8/2004 | Benda | H01H 9/282 200/43.11 |
| 2006/0151306 A1 * | 7/2006 | Lau | H01H 9/282 200/43.14 |
| 2012/0235515 A1 * | 9/2012 | Scharnick | H02J 4/00 307/328 |
| 2014/0126120 A1 * | 5/2014 | Lehtola | H05K 7/1409 361/675 |
| 2014/0146486 A1 * | 5/2014 | Hammond | H02M 7/003 361/733 |
| 2019/0252865 A1 * | 8/2019 | Bellows | H02B 1/21 |

OTHER PUBLICATIONS

The EESR issued on Aug. 1,2019 by the EPO.

* cited by examiner

HIGH-VOLTAGE ISOLATING DEVICE AND METHOD

CROSS REFERENCE

The present application claims priority to Chinese Patent Application No. 201810226020.9, tiled on Mar. 19, 2018, the entire contents of which are hereby incorporated by reference.

TECHNICAL FIELD

The present disclosure relates to the technical field of power electronics, and more particularly, to a high-voltage isolating device and method.

BACKGROUND

In order to avoid damage to maintenance personnel caused by unexpected equipment start-up or hazardous energy during equipment maintenance, the isolation and Lockout-Tagout (LOTO) of the hazardous energy is an important means to ensure the safety of the personnel and the equipment.

Isolating elements such as circuit breakers can isolate hazardous energy, but are bulky and costly. Even the size of the isolating element is reduced with development, it still cannot meet increasingly higher requirements of the industrial environment on the miniaturization of equipment. Moreover, the inconvenience of remote operation of the isolating elements also limits the development of LOTO solutions.

In high-power electricity conversion systems and energy storage systems, multiple hazardous energy sources often exist in the same system, for example, multiple battery strings are connected in parallel by DC conversion modules, and each circuit loop has a higher voltage. Therefore, when high-voltage isolation and LOTO are needed, more switching elements and LOTO elements are needed to disconnect and isolate all the circuits, which greatly increases the complexity, cost and management difficulty of the system.

It should be noted that the information disclosed in the above background section is only for enhancement of understanding the background of the present disclosure and therefore can include other information that does not form the prior art that is already known to those of ordinary skills in the art.

SUMMARY

According to an aspect of the present disclosure, there is provided a high-voltage isolating device, which includes a power module and a shelf, a back panel of the power module is provided with a first connecting portion, and a front panel of the power module is provided with a first fastening member; the shelf includes a module slot, the module slot is configured to accommodate the power module, a rear end of the module slot is provided with a second connecting portion, and a front end of the module slot is provided with a second fastening member; wherein in a first status, the first connecting portion is matched and connected with the second connecting portion, and the first fastening member is away from the second fastening member; and in a second status, the first connecting portion is disconnected from the second connecting portion, and the first fastening member and the second fastening member are matched and connected together by a padlock.

According to another aspect of the present disclosure, there is provided a high-voltage isolating method, which includes: providing a power module and a shelf, a back panel of the power module being provided with a first connecting portion, and a front panel of the power module being provided with a first fastening member; and providing a shelf, the shelf including a module slot, the module slot being configured to accommodate the power module, a rear end of the module slot being provided with a second connecting portion, and a front end of the module slot being provided with a second fastening member: wherein in a first status, the first connecting portion is matched and connected with the second connecting portion, so that the first fastening member is away from the second fastening member; and in a second status, the first connecting portion is disconnected from the second connecting portion, so that the first fastening member and the second fastening member are matched and connected together by a padlock.

BRIEF DESCRIPTION OF THE DRAWINGS

The accompanying drawings herein are incorporated in and constitute a part of this description, illustrate the embodiments in conformity with the present disclosure, and serve to explain the principles of the present disclosure together with the description. Obviously, the drawings in the following description merely relate to some embodiments of the present disclosure, and based on these drawings, those of ordinary skills in the art may obtain other drawings without going through any creative effort.

DETAILED DESCRIPTION

The example embodiments will be now described more comprehensively with reference to the drawings. However, the example embodiments can be embodied in many forms and should not be construed as being limited to the embodiments set forth herein; on the contrary, these embodiments are provided so that the present disclosure will be more comprehensive and complete, and the concept of the example embodiments will be comprehensively conveyed to those skilled in the art. Furthermore, the described features, structures, or characteristics may be combined in any suitable manner in one or more embodiments. In the following description, numerous specific details are set forth, so as to give sufficient understanding on the embodiments of the present disclosure. However, those skilled in the art will appreciate that the technical solution of the present disclosure may be practiced while omitting one or more of the specific details, or other methods, constituent elements, materials, devices, steps, etc. In other instances, various aspects of the present disclosure are not obscured by the detailed illustration or description of the known technical solutions to avoid distracting.

In addition, the drawings are only schematic illustrations of the present disclosure, and the same reference numerals in the drawings indicate the same or similar parts, so repeated descriptions thereof will be omitted.

The embodiments of the present disclosure will be described in detail hereinafter with reference to the accompanying drawings.

Figure 1:
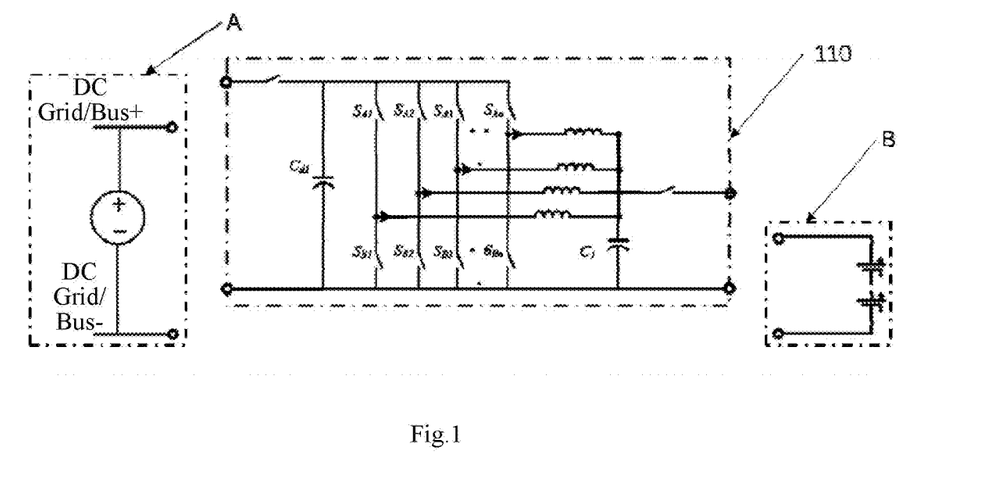
FIG. 1 is a circuit schematic diagram of a high-voltage isolating device according to an embodiment of the present disclosure.

FIG. 1 illustrates a power schematic diagram of a high-voltage isolating device according to an embodiment of the present disclosure. Referring to FIG. 1 a power circuit 110 is disposed between a high-voltage power supply A and a storage battery B to realize energy conversion between the power supply A and the battery B. When high-voltage isolation is needed, the power circuit 110 is integrally served as an isolating element and removed from the circuit, then a power supply loop is divided into three parts, i.e., a power supply A part, the power circuit 110 part (isolating element part), and the storage battery C part, thereby isolating hazardous energy for equipment maintenance, etc. When high-voltage connection is needed, the power circuit 110 is re-connected to the circuit, an electrical loop is switched on, and a system operates normally. In this way, safe and quick high-voltage isolation can he realized without additional electrical isolating equipment, the mechanical structure is simple, the device size is small, and the cost is low.

It should be understood that circuit topologies of the power supply A, the power circuit 110, and the storage battery B are only exemplary embodiment, and the present disclosure is not limited thereto. In any other application requiring high-voltage isolation, the isolation of dangerous energy can be realized by taking a part of the electrical circuit integrally as the isolating element and dividing the electrical circuit into an input part, an isolating element part and an output part.

Figure 2:
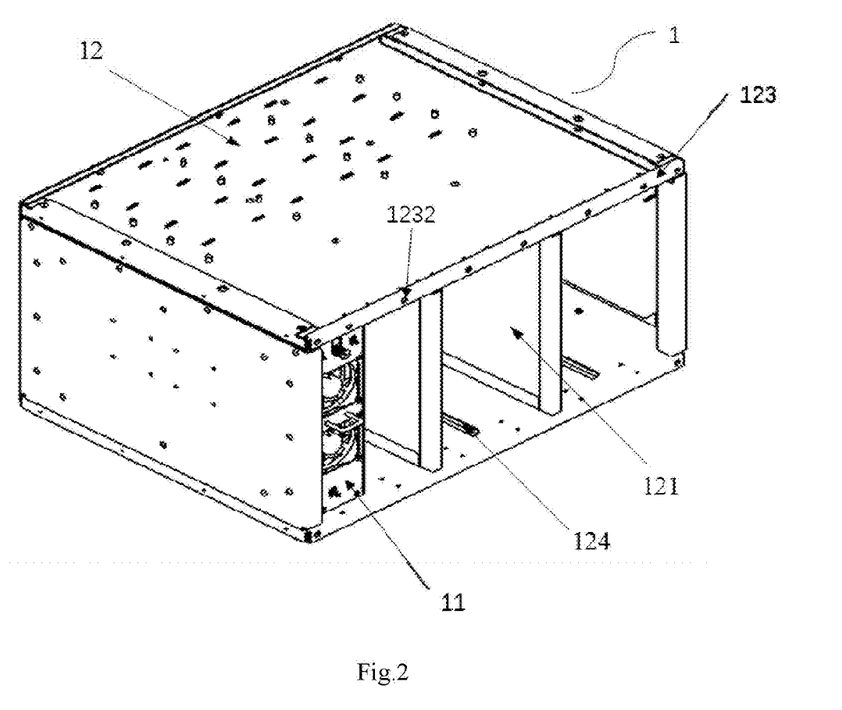
FIG. 2 is a schematic diagram of a high-voltage isolating device according to an embodiment of the present disclosure.
Figure 3A:
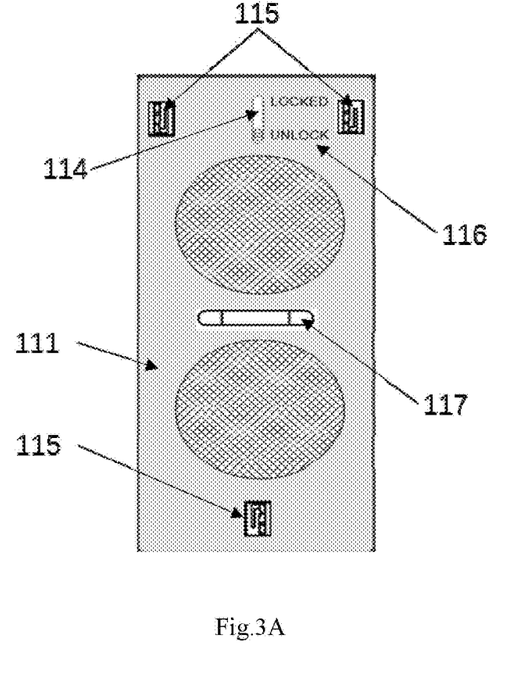
FIG. 3A is a schematic diagram of a front panel of a power module when a high-voltage isolating device is in a first status according to an embodiment of the present disclosure.
Figure 3B:
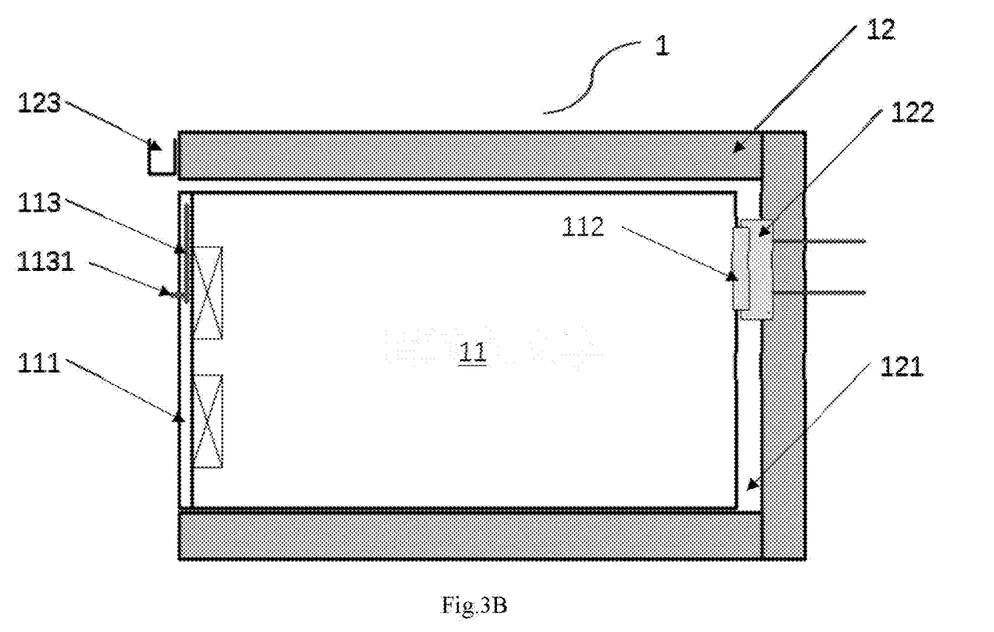
FIG. 3B is a schematic diagram of a high-voltage isolating device in a first status according to an embodiment of the present disclosure.
Figure 4A:
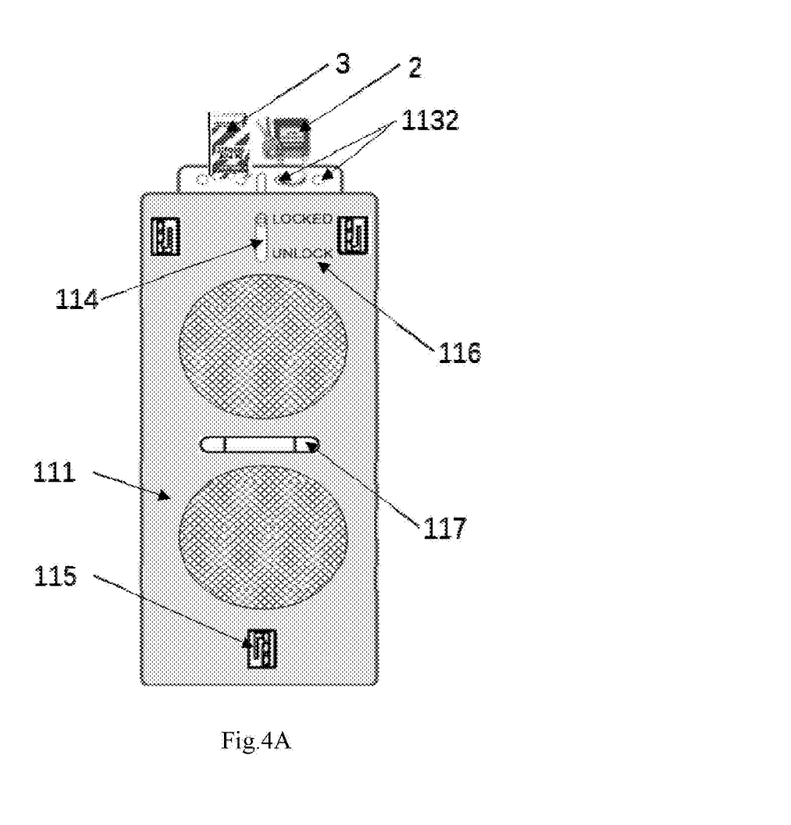
FIG. 4A is a schematic diagram of a front panel of a power module when a high-voltage isolating device is in a second status according to an embodiment of the present disclosure.
Figure 4B:
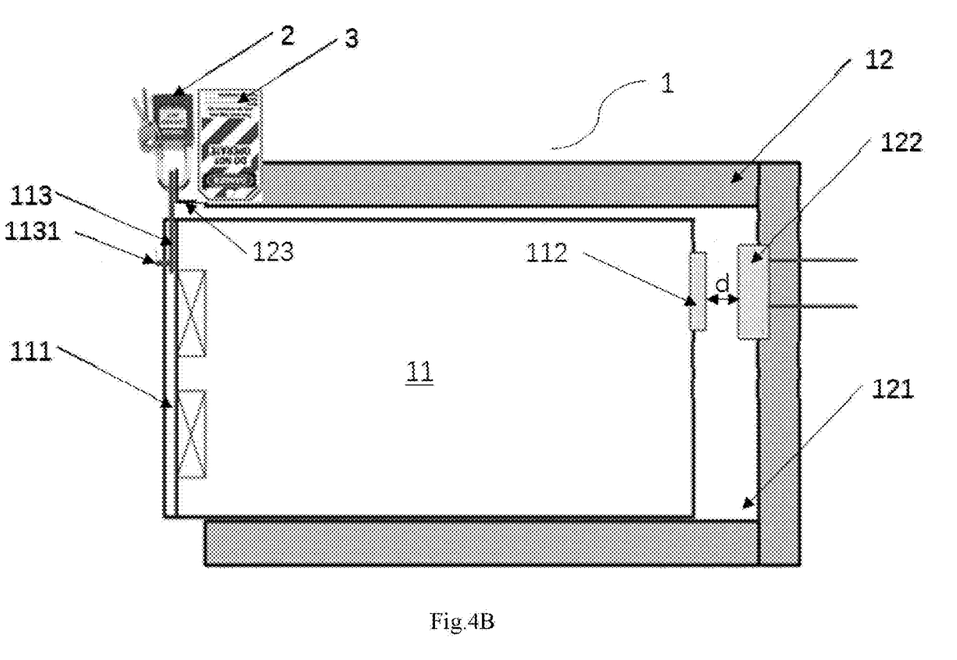
FIG. 4B is a schematic diagram of a high-voltage isolating device in a second status according to an embodiment of the present disclosure.

FIG. 2 illustrates a schematic diagram of a high-voltage isolating device according to an embodiment of the present disclosure. FIG. 3A illustrates a schematic diagram of a front panel of a power module when a high-voltage isolating device is in a first status according to an embodiment of the present disclosure. FIG. 3B illustrates a schematic diagram of a high-voltage isolating device in a first status according to an embodiment of the present disclosure. FIG. 4A illustrates a schematic diagram of a front panel of a power module when a high-voltage isolating device is in a second status according to an embodiment of the present disclosure. FIG. 4B illustrates a schematic diagram of a high-voltage isolating device in a second status according to an embodiment of the present disclosure.

Referring to FIGS. 2 to 4B, the high-voltage isolating device 1 includes at least a power module 11 and a shelf 12. The shelf 12 includes at least a module slot 121, each module slot 121 is used for accommodating a power module 11. An interior of the power module 11 may include one or more power circuits, or include a part of one or more electrical loops, and the type and number of circuits included in the power module are not limited here. Moreover, the number of the power modules 11 and the module slots 121 is not limited here, and may be one or more.

A back panel of a module slot 11 is provided with a first connecting portion 112, and a front panel 111 of the module slot 11 is provided with a first fastening member 113, wherein the first connecting portion 112 is connected with an input and an output of a circuit in the power module 11. A rear end of a module slot 121 is provided with a second connecting portion 122, and a front end of the module slot 121 is provided with a second fastening member 123, wherein the second connecting portion 122 is connected with an input and an output of an electrical loop. As shown in FIGS. 3A to 3B, in a first status, i.e., a high-voltage connection status, the first connecting portion 112 is matched and connected with the second connecting portion 122, the first fastening member 113 is away from the second fastening member 123, the electrical circuit is switched on, and a system operates normally. As shown in FIGS. 4A to 4B, in a second status, i.e., a high-voltage disconnection and isolation status, the first connecting portion 112 is disconnected from the second connecting portion 122, the first fastening member 113 and the second fastening member 123 are matched and connected together by a padlock 2 to isolate hazardous energy, and the system is under maintenance.

It's worth noting that the first connecting portion 112 and the second connecting portion 122 here may be connectors matched mutually. The power module 11 is integrally used as an isolating element, and the connection or disconnection of the electrical loop is realized by the quick connection or disconnection of the first connecting portion 112 and the second connecting portion 122. In addition, the form of the padlock 2 is not limited here as long as it can realize the connection limitation of the first fastening member 113 and the second fastening member 123.

In some embodiments, as shown in FIGS. 3A to 4B, the front panel 111 of the power module 11 is provided with a sliding slot 114, and the first fastening member 113 slides up and down along the sliding slot 114 to be matched with or away from the second fastening member 123.

In some embodiments, the first fastening member 113 may be provided with a protruding portion 1131, the protruding portion 1131 penetrates through the sliding slot 114 to an outside of the front panel 111 of the power module 11, and the first fastening member 113 is matched with or away from the second fastening member 123 by controlling the protruding portion 1131 to slide up and down along the sliding slot 114.

In some embodiments, the first fastening member 113 is provided with a first lockhole 1132, the second fastening member 123 is provided with a second lockhole 1232, and the padlock 2 passes through the first lockhole 1132 and the second lockhole 1232 to connect the first fastening member 113 with the second fastening member 123.

In some embodiments, the front panel 111 of the power module 11 may be provided with a locking member 115, and after the power module 11 is pulled out from the module slot 121, the locking member 115 is matched with the shelf 12 to fix the power module 11 and prevent the power module 11 from sliding. The locking member 115 may be a bayonet structure, and can achieve quick fixation.

In some embodiments, the front panel 111 of the power module 11 may also be provided with a status flag 116, in the first status, the status flag 116 indicates a first flag "UNLOCK"; and in the second status, the status flag 116 indicates a second flag "LOCKED". It should be understood that the first flag and the second flag in the present disclosure are not limited to being represented by the characters "UNLOCK" and "LOCKED", and other characters, patterns, light, and the like may be used as long as the two status indications can be distinguished.

In some embodiments, in order to move the power module 11 within the module slot 121, the front panel 111 of the power module 11 may further be provided with a handle 117 through which the power module 11 is pulled out or pushed into the module slot 121.

In some embodiments, in order to quickly and stably pull out or push the power module 11 into the module slot 121, a handle 117 may be disposed at a middle of the front panel 111 of the power module 11 to minimize tension or thrust.

Figure 5A:
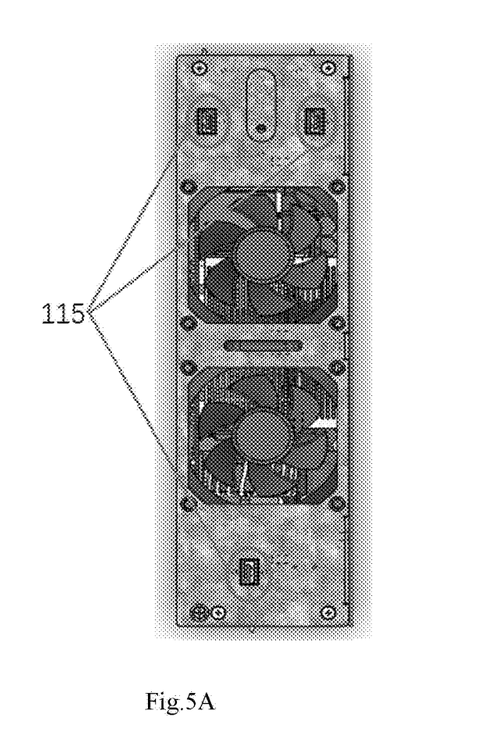
FIG. 5A is a schematic diagram of a front end of a power module according to an embodiment of the present disclosure.
Figure 5B:
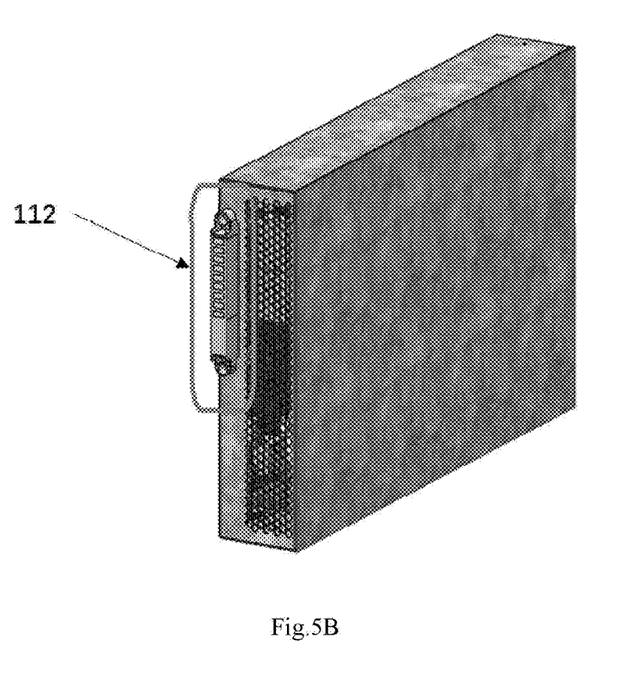
FIG. 5B is a schematic diagram of a rear end of a power module according to an embodiment of the present disclosure.
Figure 6A:
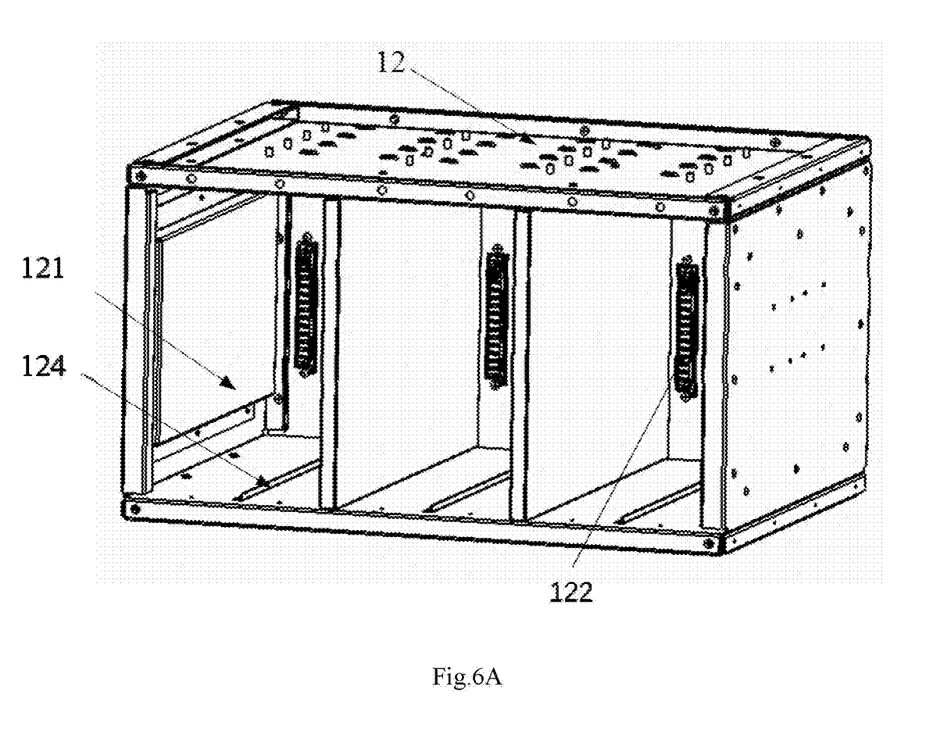
FIG. 6A is a schematic diagram of a front end of a shelf according to an embodiment of the present disclosure.
Figure 6B:
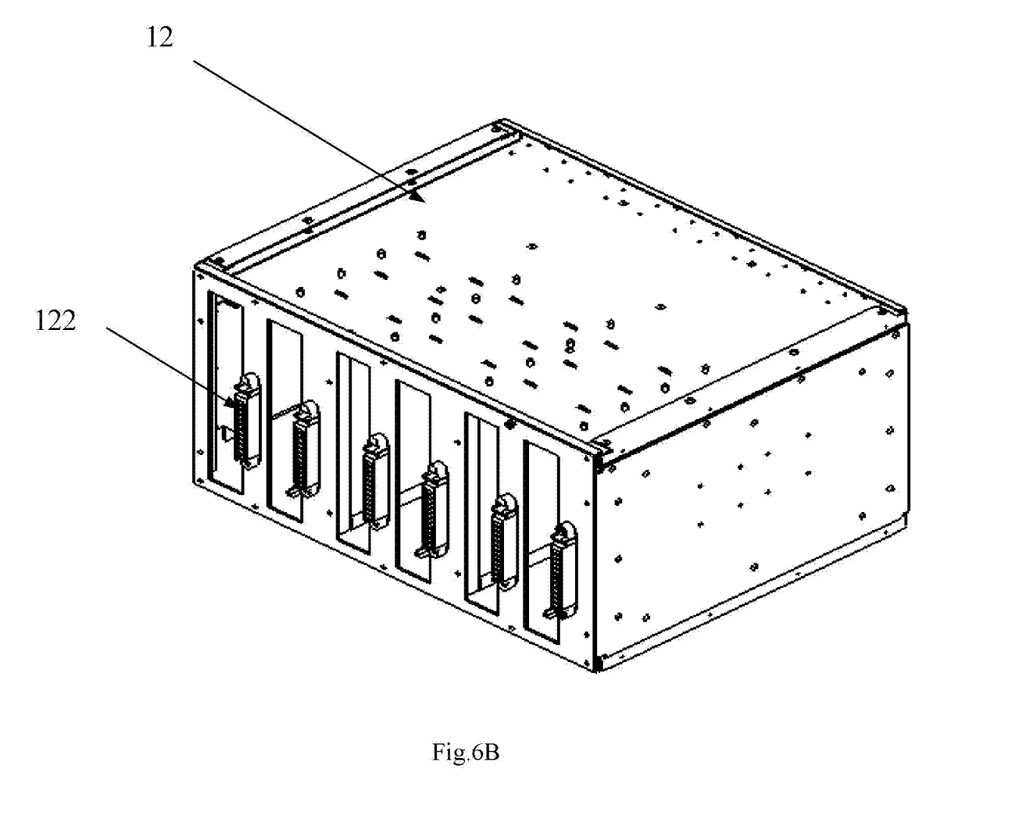
FIG. 6B is a schematic diagram of a rear end of a shelf according to an embodiment of the present disclosure.

FIG. 5A illustrates a schematic diagram of a front end of a power module according to an embodiment of the present disclosure. FIG. 5B illustrates a schematic diagram of a rear end of a power module according to an embodiment of the present disclosure. FIG. 6A illustrates a schematic diagram of a front end of a shelf according to an embodiment of the present disclosure. FIG. 6B illustrates a schematic diagram of a rear end of a shelf according to an embodiment of the present disclosure.

Referring to FIGS. 5A to 6B, in some embodiments, the first connecting portion 112 matched and connected with the second connecting portion 122 may be a male connecting terminal, and the second connecting portion 122 may be a female connecting terminal, so that it is equivalent to fixing the female connecting terminal, and the connection or disconnection of the circuit is realized by plugging or unplugging the male connecting terminal, which is safer and more reliable. In some other embodiments, the first connecting portion 112 may also be the female connecting terminal, and the second connecting portion 122 may be the male connecting terminal. The person skilled in the art may set the type of the connecting terminal according to actual conditions, and this is not particularly limited in the present disclosure.

In some embodiments, in order to achieve reliable connection of the first connecting portion 112 and the second connecting portion 122, an offset may exist between the first connecting portion 112 and the second connecting portion 122.

In some embodiments, as shown in FIG. 4B, in order to ensure effective high-voltage isolation, in the second status, a distance d between the first connecting portion 112 and the second connecting portion 122 is greater than a safety distance.

In some embodiments, as shown in FIG. 6A, the module slot 121 may be internally provided with a guiding part 124 to facilitate moving the power module 11 along the guiding part 124 in the module slot 121. The guiding part 124 may be, for example, a slide rail or the like.

In some embodiments, as shown in FIGS. 4A to 4B, in the second status, the matched first fastening member 113 and second fastening member 123 may be provided with a warning board 3 to match with the padlock 2 to achieve LOTO. Therefore, not only unnecessary equipment startup can be avoided, but also relevant personnel are alerted to avoid danger.

One end of the power module according to the embodiment of the present disclosure is mounted with a male quick connector, and an input end and an output end of the power supply are both connected to a female quick connector. The electrical loop can be quickly switched on and off by plugging and unplugging the quick connector. For example, when the system is in operation, the male and female connectors can be connected; when the system is under maintenance, the male and female connectors can be disconnected to realize high-voltage isolation quickly. Meanwhile, the LOTO structure (the first fastening member 113 and the second fastening member 123 shown in FIG. 3B) and the padlock 2 configured can fix the power module, and the warning board 3 arranged beside the padlock can ensure the working safety of maintenance personnel.

According to the embodiments of the present disclosure, the high-voltage power module is packetized as the isolating element, and the connection and disconnection of the electrical circuit are completed through the on-off of the quick connector on the isolating element, so that safe and quick high-voltage isolation can be achieved without additional electrical isolating equipment, the mechanical structure is simple, the device size is small, and the cost is low Moreover, the operability is strong since both the operation switch and the working status flag are disposed in the front panel of the power module. Meanwhile, the safe operation of operators can be ensured by setting the LOTO structure to fix the isolated power module and the shelf and setting the striking warning board.

Corresponding to the above embodiment of the high-voltage isolating device, the present disclosure also provides a high-voltage isolating method.

In some embodiments, with reference to FIGS. 2 to 4B, there is provided a high-voltage isolating method, which includes: providing a power module 11, a back panel of the power module 11 being provided with a first connecting portion 112, and a front panel 111 of the power module being provided with a first fastening member 113 and providing a shelf 12, the shelf 12 including a module slot 121, the module slot 121 being used for containing the power module 11, a rear end of the module slot 121 being provided with a second connecting portion 122, and a front end of the module slot 121 being provided with a second fastening member 123. In a first status, i.e., a high-voltage connection status, the first connecting portion 112 is matched and connected with the second connecting portion 122, so that the first fastening member 113 is away from the second fastening member 123, the electrical circuit is switched on, and a system operates normally. In a second status, i.e., a high-voltage disconnection and isolation status, the first connecting portion 112 is disconnected from the second connecting portion 122, so that the first fastening member 113 and the second fastening member 123 are matched and connected together by a padlock 2 to isolate hazardous energy, and facilitate the system maintenance.

In some embodiments, when the high-voltage isolating device 1 is in a high-voltage isolation status and high-voltage connection is needed, the first fastening member 113 can he away from the second fastening member 123 by unlocking and taking off the padlock then, the power module 11 is pushed into the module slot 121, so that the first connecting portion 112 is matched and connected with the second connecting portion 122 to make the power module 11 in the first status.

In some embodiments, when the high-voltage isolating device 1 is in a high-voltage connection status and high-voltage isolation is needed, the front panel 111 of the power module 11 can be protruded from the module slot 121 by pulling the power module 11 out of the module slot 121, so as to disconnect the first connecting portion 112 from the second connecting portion 122; then, the first fastening member 113 is matched with the second fastening member 123, and the padlock 2 is hung and locked to make the power module 11 in the second status.

In some embodiments, the front panel 111 of the power module 11 may be provided with a sliding slot 114, and the first fastening member 113 is controlled to slide up and down along the sliding slot 114, so that the first fastening member 113 is matched with or away from the second fastening member 123.

In some embodiments, the first fastening member 113 may be provided with a protruding portion 1131, the protruding portion 1131 penetrates through the sliding slot 114 to an outside of the front panel 111 of the power module 11, and the first fastening member 113 is matched with or away from the second fastening member 123 by controlling the protruding portion 1131 to slide up and down along the sliding slot 114. For example, the protruding portion 1131 is controlled to slide up along the sliding slot 114 to drive the first fastening member 113 to be close to and matched with the second fastening member 123, and then the padlock 2 is hung to achieve locking; when the padlock 2 is unlocked, the protruding portion 1131 is controlled to slide down along the sliding slot 114 to drive the first fastening member 113 to be away from the second fastening member 123 to achieve unlocking.

In some embodiments, to facilitate setting the padlock 2, the first fastening member 113 may be provided with a first lockhole 1132, the second fastening member 123 may be provided with a second lockhole 1232, and the padlock 2 passes through the first lockhole 1132 and the second lockhole 1232 to connect the first fastening member 113 with the second fastening member 123.

In some embodiments, the front panel 111 of the power module 11 may be provided with a locking member 115, and after the power module 11 is pulled out of the module slot 121, the locking member 115 is matched with the shelf 12 to fix the power module 11.

In some embodiments, in order to display a working status of the system, the front panel 111 of the power module 11 may be provided with a status flag 116, in the first status, the status flag 116 indicates a first flag; and in the second status, the status flag 116 indicate a second flag.

In some embodiments, in order to facilitate pulling out or pushing in the power module 11, the front panel 111 of the power module 11 may further be provided with a handle 117 to move the power module 11 in the module slot 121 by pulling or pushing the handle 117.

In some embodiments, in order to realize quick and reliable connection or disconnection between the power module 11 and the module slot 121, the first connecting portion 112 may be set as a male connecting terminal, the second connecting portion 122 may be set as a female connecting terminal, and the first connecting portion 112 and the second connecting portion 113 are connected or disconnected by controlling the male connecting terminal to plug in or unplug from the female connecting terminal.

In some embodiments, as shown in FIG. 6A, the module slot 121 may be internally provided with a guiding part 124 to move the power module 11 along the guiding part 124 in the module slot 121, which is more convenient, stable, and labor-saving.

In some embodiments, as shown in FIGS. 4A to 4B, in the second status, i.e., the high-voltage isolation status, a warning board 3 is disposed in the matched first and second fastening members 113 and 123 to match with the padlock 2 to achieve LOTO.

According to the embodiments of the present disclosure, the high-voltage power module is packetized as the isolating element, and the connection and disconnection of the electrical circuit are completed by plugging and unplugging the quick connector on the isolating element, so that safe and quick high-voltage isolation can be achieved without additional electrical isolating equipment, the mechanical structure is simple, the device size is small, and the cost is low. Moreover, the operability is strong since both the operation switch and the working status flag are disposed in the front panel of the power module. Meanwhile, the safe operation of operators can be ensured by setting the LOTO structure to fix the isolated power module and the shelf and setting the striking warning board.

Other embodiments of the present disclosure will be apparent to those skilled in the art from consideration of the specification and practice of the present disclosure. This application is intended to cover any variations, uses, or adaptations of the present disclosure following the general principles thereof and including such departures from the present disclosure as come within known or customary practice in the art. The description and embodiments are to be regarded as illustrative only, and the real scope and conceive of the invention are pointed out in the claims.

What is claimed is:

1. A high-voltage isolating device, comprising:
   a power module, a back panel of the power module being provided with a first connecting portion, and a front panel of the power module being provided with a first fastening member; and
   a shelf, comprising a module slot, the module slot being configured to accommodate the power module, a rear end of the module slot being provided with a second connecting portion, and a front end of the module slot being provided with a second fastening member;
   wherein in a first status, the first connecting portion is matched and connected with the second connecting portion, and the first fastening member is away from the second fastening member; and in a second status, the first connecting portion is disconnected from the second connecting portion, and the first fastening member and the second fastening member are matched and connected together by a padlock.

2. The high-voltage isolating device according to claim 1, wherein the front panel of the power module is provided with a sliding slot, and the first fastening member slides up and down along the sliding slot to be matched with or away from the second fastening member.

3. The high-voltage isolating device according to claim 2, wherein the first fastening member is provided with a protruding portion, the protruding portion penetrates through the sliding slot to an outside of the front panel of the power module, and the first fastening member is matched with or away from the second fastening member by controlling the protruding portion to slide up and down along the sliding slot.

4. The high-voltage isolating device according to claim 1, wherein the first fastening member is provided with a first lockhole, the second fastening member is provided with a second lockhole, and the padlock passes through the first lockhole and the second lockhole to connect the first fastening member with the second fastening member.

5. The high-voltage isolating device according to claim 1, wherein the front panel of the power module is provided with a locking member, and the locking member is matched with the shelf to fix the power module.

6. The high-voltage isolating device according to claim 1, wherein the front panel of the power module is provided with a status flag, the status flag indicating a first flag in the first status and indicating a second flag in the second status.

7. The high-voltage isolating device according to claim 1, wherein the front panel of the power module is provided with a handle for controlling the power module to move in the module slot.

8. The high-voltage isolating device according to claim 1, wherein the first connecting portion comprises a male connecting terminal, and the second connecting portion comprises a female connecting terminal.

9. The high-voltage isolating device according to claim 1, wherein an offset exists between the first connecting portion and the second connecting portion to enable reliable connection between the first connecting portion and the second connecting portion.

10. The high-voltage isolating device according to claim 1, wherein in the second status, a distance between the first connecting portion and the second connecting portion is greater than a safety distance.

11. The high-voltage isolating device according to claim 1, wherein the module slot is internally provided with a guiding part, and the power module moves along the guiding part;
wherein the guiding part comprises a slide rail.

12. The high-voltage isolating device according to claim 1, wherein in the second status, the first fastening member and the second fastening member in matched state are provided with a warning board, the warning board matching with the padlock to achieve LOTO.

13. A high-voltage isolating method, comprising:
providing a power module, a back panel of the power module being provided with a first connecting portion, and a front panel of the power module being provided with a first fastening member; and
providing a shelf, the shelf comprising a module slot, the module slot being configured to accommodate the power module, a rear end of the module slot being provided with a second connecting portion, and a front end of the module slot being provided with a second fastening member;
wherein in a first status, the first connecting portion is matched and connected with the second connecting portion, enabling the first fastening member to be away from the second fastening member; and in a second status, the first connecting portion is disconnected from the second connecting portion, enabling the first fastening member and the second fastening member to be matched and connected together by a padlock.

14. The high-voltage isolating method according to claim 13, further comprising at least one step of:
enabling to be in the first status, unlocking and taking off the padlock, enabling the first fastening member to be away from the second fastening member, and pushing the power module into the module slot, enabling the first connecting portion to be matched and connected with the second connecting portion; and
enabling to be in the second status, pulling the power module out from the module slot, enabling the front panel of the power module to protrude from the module slot to disconnect the first connecting portion from the second connecting portion, and matching the first fastening member with the second fastening member, hanging and locking the padlock.

15. The high-voltage isolating method according to claim 13, further comprising:
controlling the first fastening member to slide up and down along a sliding slot disposed in the front panel of the power module, enabling the first fastening member to be matched with or away from the second fastening member.

16. The high-voltage isolating method according to claim 13, further comprising:
passing the padlock through a first locking hole disposed in the first fastening member and a second locking hole disposed in the second fastening member to connect the first fastening member with the second fastening member.

17. The high-voltage isolating method according to claim 13, further comprising at least one step of:
matching a locking member disposed in the front panel of the power module with the shelf to fix the power module; and
pulling or pulling a handle disposed in the front panel of the power module to move the power module in the module slot.

18. The high-voltage isolating method according to claim 13, further comprising:
setting the first connecting portion comprising a male connecting terminal, setting the second connecting portion comprising a female connecting terminal, and connecting or disconnecting the first connecting portion and the second connecting portion by controlling the male connecting terminal to plug in or unplug from the female connecting terminal.

19. The high-voltage isolating method according to claim 13, further comprising:
moving the power module along a guiding part disposed in the module slot to move the power module in the module slot.

20. The high-voltage isolating method according to claim 13, further comprising:
disposing, in the second status, a warning board at the first fastening member and the second fastening member in matched state to match with the padlock to achieve LOTO.

* * * * *